(12) United States Patent
Salib

(10) Patent No.: US 6,810,241 B1
(45) Date of Patent: Oct. 26, 2004

(54) MICROWAVE DIODE MIXER

(75) Inventor: Mike L. Salib, Millersville, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 277 days.

(21) Appl. No.: 10/058,279

(22) Filed: Jan. 30, 2002

(51) Int. Cl.⁷ .................................................. H04B 1/26
(52) U.S. Cl. ....................... 455/326; 455/323; 455/327; 455/328; 455/330
(58) Field of Search ................................ 455/326, 330, 455/327, 328, 333, 318–320, 325, 331, 313, 302–306; 327/113, 355, 356, 361, 119, 120

(56) References Cited

U.S. PATENT DOCUMENTS 5,678,225 A * 10/1997 Kobayashi .................. 455/330
5,740,528 A * 4/1998 Drennen ..................... 455/327
5,819,169 A * 10/1998 Fudem ....................... 455/326
5,854,974 A * 12/1998 Li ............................... 455/330
6,078,802 A * 6/2000 Kobayashi .................. 455/326
6,094,570 A * 7/2000 Consolazio ................. 455/327
6,115,594 A * 9/2000 Pozdeev et al. ............ 455/326
6,263,198 B1 * 7/2001 Li .............................. 455/327
6,427,069 B1 * 7/2002 Galin ......................... 455/326

* cited by examiner

Primary Examiner—Pablo N. Tran

(57) ABSTRACT

A mixer having a diode quad, and which receives two RF signals at an RF input balun having primary and secondary windings. A resonant circuit arrangement includes at least a capacitor circuit element in parallel with the secondary winding to form an open circuit termination for the second harmonics of the input RF signals.

5 Claims, 2 Drawing Sheets

MICROWAVE DIODE MIXER

BACKGROUND OF THE INVENTION

1. Field of the Invention

The invention in general relates to electronic circuits, and more particularly to a diode mixer with reduced noise and improved dynamic range.

2. Description of Related Art

A mixer is an electronic circuit which converts an input signal from one frequency to another. Basically, this is accomplished by combining the input signal with the signal from a local oscillator in a non-linear device such as a diode quad. As a result of the process, various frequencies are generated, including sum and difference frequencies. The difference frequency may be selected as the intermediate frequency (IF) for further processing.

In various electronic systems, however, such as in communication and radar systems, two signals, which are very close in frequency, may be simultaneously presented to the mixer input. These two signals combine in the mixer to generate unwanted intermodulation products which have the effect of degrading the dynamic range of the mixer.

It is a primary object of the present invention to provide a mixer having improved dynamic range and a high third order intercept point, which is a figure of merit related to mixer performance.

SUMMARY OF THE INVENTION

A microwave diode mixer is provided and includes an RF signal input which receives first and second RF signals of closely related frequencies. A local oscillator signal input receives a local oscillator signal, and the two inputs are connected to a diode quad having four arms, each arm including at least one, and preferably three, diodes.

An RF balun device couples the RF signal input to the diode quad and a local oscillator balun device couples the local oscillator signal input to the diode quad.

A resonant circuit arrangement is connected across the diode quad and has a bandwidth to present a substantially open circuit to the second harmonics of both the first and second RF input signals. This reduces or eliminates intermodulation products which may be produced as a result of the mixing process.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are given by way of illustration only, and wherein.

DESCRIPTION OF THE PREFERRED EMBODIMENT

Figure 1:
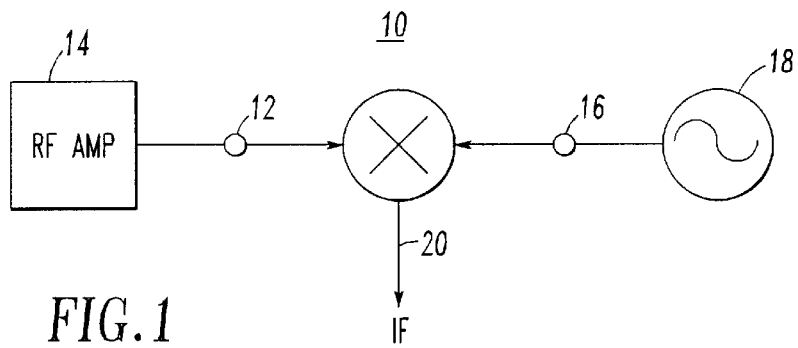
FIG. 1 is a simplified block diagram of a mixer.

In FIG. 1, mixer 10 includes an RF input 12 for receiving an RF signal from a circuit, such as RF amplifier 14. Mixer 10 also includes a second input 16 to which is applied a sine wave output signal of a local oscillator 18. These signals are mixed by a non-linear process known as heterodyning, resulting in a plurality of generated signals, among which is, after suitable filtering, a desired IF signal having a frequency which is the difference between the local oscillator frequency and the RF signal frequency.

In various electronic systems, such as a Doppler radar system, by way of example, two RF signals, very close in frequency, may be applied to the mixer 10 at the RF input 12. The second harmonic of these two RF signals produce unwanted intermodulation products which degrade mixer operation by reducing its dynamic range and masking desired target returns.

The mixer of the present invention obviates this drawback when two input RF signals, closely spaced in frequency, are converted to intermediate frequencies. For purposes of discussion the various frequencies involved in the operation are defined in the following TABLE 1.

TABLE 1

$F_{RF1}$: input RF signal 1 frequency
$F_{RF2}$: input RF signal 2 frequency
$2F_{RF1}$: second harmonic of signal 1
$2F_{RF2}$: second harmonic of signal 2
$F_{LO}$: local oscillator frequency
$F_{IF1}$: intermediate frequency of signal 1
($F_{IF1} = F_{LO} - F_{RF1}$)
$F_{IF2}$: intermediate frequency of signal 2
($F_{IF2} = F_{LO} - F_{RF2}$)
$F_{IP1}$: intermodulation product 1 frequency
($F_{IP1} = 2F_{RF1} - F_{RF2}$)
$F_{IP2}$: intermodulation product 2 frequency
($F_{IP2} = 2F_{RF2} - F_{RF1}$)
$F_{IFIP1}$: intermediate frequency of intermodulation product 1
($F_{IFIP1} = F_{LO} - F_{IP1}$)
$F_{IFIP2}$: intermediate frequency of intermodulation product 2
($F_{IFIP2} = F_{LO} - F_{IP2}$)

Figure 2:
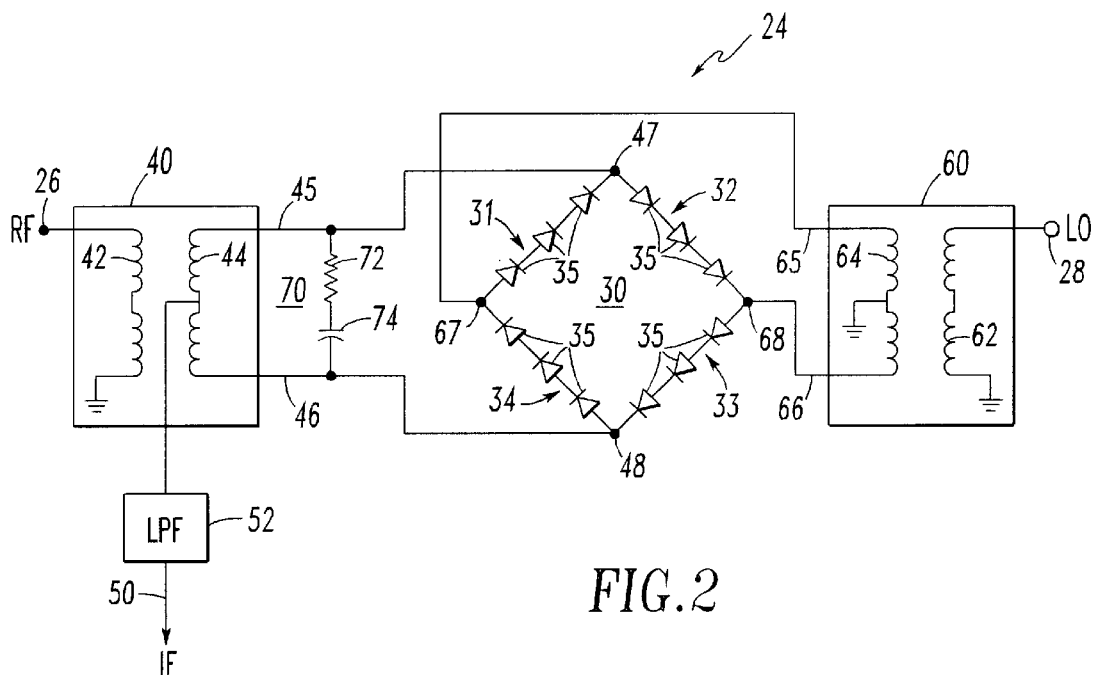
FIG. 2 is a circuit diagram of a preferred embodiment of the present invention.

FIG. 2 illustrates the circuit layout of a preferred embodiment of the invention which lends itself to conventional monolithic microwave integrated circuit (MMIC) construction. The mixer 24 includes an RF input 26 which receives two RF signals closely spaced in frequency, and a local oscillator input 28 which receives the input sine wave signal of a local oscillator.

A diode bridge, or quad, 30 includes four arms 31 to 34, each including at least one diode 35. In the embodiment illustrated, each arm includes three diodes 35. It is well known that a three diode arm structure increases the third order intercept point, however the power requirement of the local oscillator needed to drive the diodes also increases.

An RF balun 40 couples the RF input 26 to the diode quad 30. Basically, the balun is an impedance matching device and in the embodiment illustrated in FIG. 2, is constituted by a primary winding 42 and a secondary winding 44, having leads 45 and 46 respectively connected to junction points 47 and 48 of diode quad 30.

The center point of secondary winding 44 is connected to the IF output 50, with the connection including low pass Filter 52.

A local oscillator balun 60 couples the local oscillator input 28 to the diode quad 30 and includes a primary winding 62 and a secondary winding 64, having leads 65 and 66 respectively connected to junction points 67 and 68 of diode quad 30.

The respective second harmonic, $2F_{RF1}$ and $2F_{RF2}$, of the two RF input signals $F_{RF1}$ and $F_{RF2}$ are generated in the diode quad 30 and combine with the input signals to form unwanted intermodulation products $F_{IP1}=2F_{RF1}-F_{RF2}$ and $F_{IP2}=2F_{RF2}-F_{RF1}$. The mixer of the present invention eliminates or significantly reduces the second harmonics of the input signals to eliminate or significantly reduce the unwanted intermodulation products. The result of this is to increase the dynamic range of the mixer. In this manner, in the case of a Doppler radar system for example, previously masked targets will now be able to be detected.

The substantial elimination of the second harmonics of the input RF signals (and therefore the substantial elimination of the intermodulation products) is accomplished with the inclusion of a resonant circuit arrangement 70 in shunt with the diode quad 30. This resonant circuit arrangement is located between the primary winding 42 of the RF balun 40, and the diode quad 30.

More particularly, the arrangement includes a string of circuit elements, constituted by resistor 72 and capacitor 74 connected in parallel with the secondary winding 44 of the RF balun 40. The respective values of the resonant circuit elements (the resistance of resistor 72, the capacitance of capacitor 74 and inductance of winding 44) are selected such that the resonant circuit arrangement 70 is resonant at a band which includes the second harmonic of each of the two RF input signals.

With this arrangement, the parallel resonant circuit presents an open circuit to the second harmonic currents generated by the non-linearity of the diode quad 30 to reduce or substantially eliminate these currents. With a reduction or elimination of these second harmonics the intermodulation products are likewise reduced or eliminated.

By way of example, a mixer, as in FIG. 2, was fabricated by well-known MMIC techniques for operation in the frequency range of 1500 MHz to 2000 MHz. Two RF input signals were applied having closely related respective frequencies of 1900 MHz and 1900.6 MHz, a difference of around 0.032%. With a local oscillator frequency of 2140 MHz, the frequencies defined in table 1 are given in TABLE 2.

TABLE 2

| |
|---|
| $F_{RF1}$: 1900 MHz |
| $F_{RF2}$: 1900.6 MHz |
| $2F_{RF1}$: 3800 MHz |
| $2F_{RF2}$: 3801.2 MHz |
| $F_{LO}$: 2140 MHz |
| $F_{IF1}$: 240 MHz |
| $F_{IF2}$: 239.4 MHz |
| $F_{IP1}$: 1899.4 MHz |
| $F_{IP2}$: 1901.2 MHz |
| $F_{IFIP1}$: 240.6 MHz |
| $F_{IFIP2}$: 238.8 MHz |

It is seen from TABLE 2 that if the second harmonics of the input RF signals are not eliminated, the intermodulation products will result in IF signals $F_{IFIP1}$ and $F_{IFIP2}$ of respective frequencies 240.6 MHz and 238.8 MHz. These frequencies are very close to the actual target IF signals of 240 MHz and 239.4 MHz and may mask these target signals. By eliminating the unwanted frequencies, the dynamic range of the mixer is improved so that previously undetectable targets may now be detected.

Figure 3:
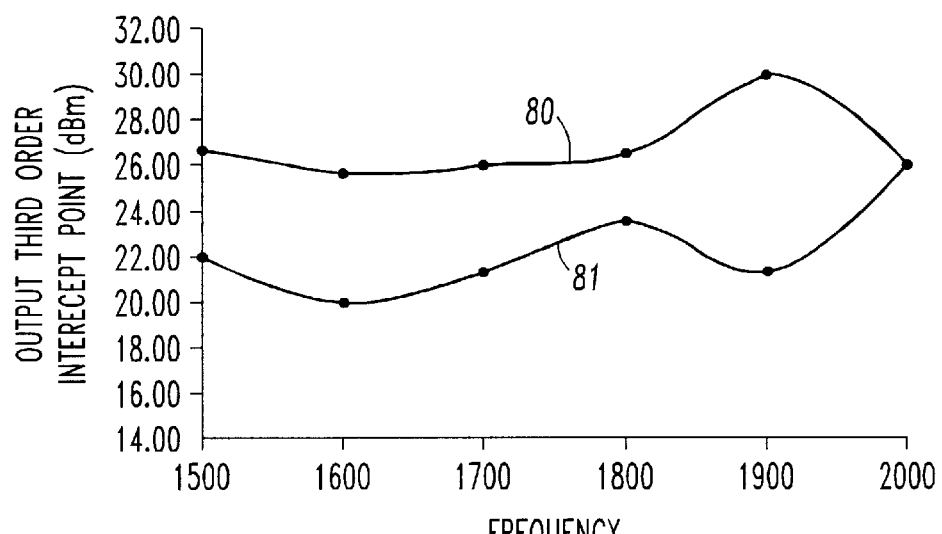
FIG. 3 is a plot of output third order intercept point with and without the present invention.

As previously stated, the third order intercept point is a figure of merit related to mixer performance. Curve 80 of FIG. 3 illustrates a plot of output third order intercept point in dBm (decibels in terms of its ratio to one milliwatt) over a frequency range of 1500 MHz to 2000 MHz for the mixer 24 illustrated in FIG. 2. For comparison, curve 81 is a similar plot for a conventional mixer without the harmonic termination of the present invention. It is seen that by providing a resonant circuit arrangement, resonant at the second harmonic of the input RF signals, an improvement of up to around 8 dBm is achieved.

The reduction or elimination of the second harmonics of the RF input signals improves the linearity of the mixer. This may be demonstrated from the measurement of output power of the IF signal versus the input power of the RF signal (utilizing a single RF signal).

Figure 4:
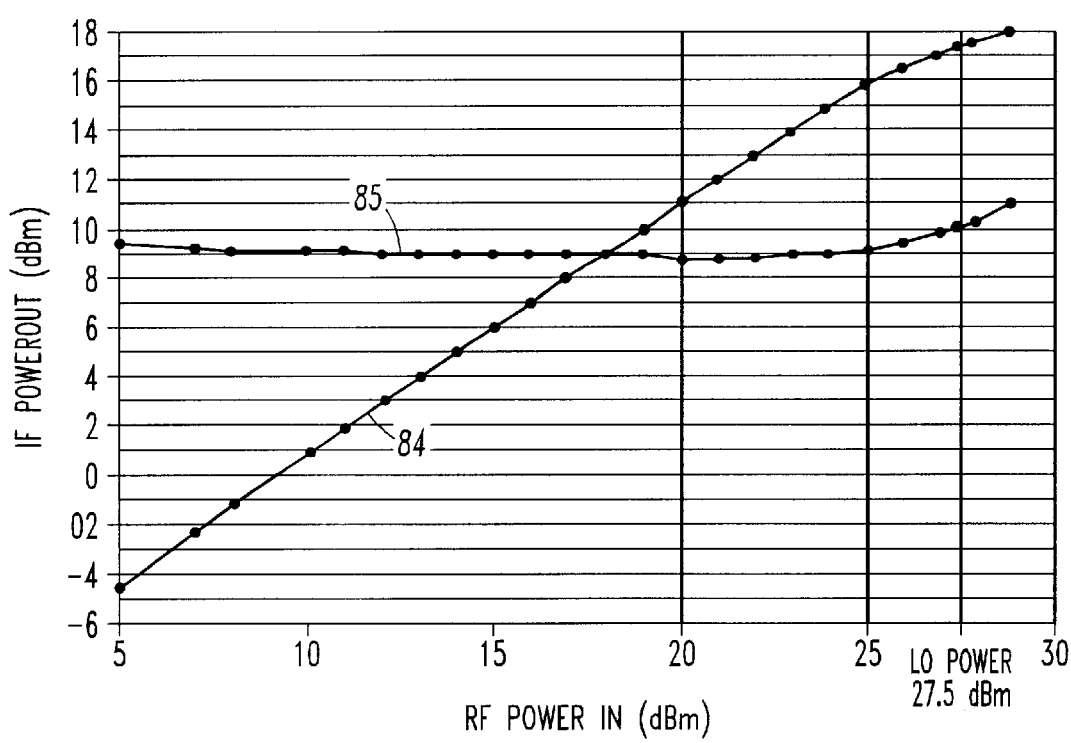
FIG. 4 illustrates plots related to IF output power as a function of RF input power.

Curve 84 of FIG. 4 shows the measured IF power out Vs the RF power in, of the mixer of FIG. 2, and curve 85 illustrates the conversion loss in dB. Conversion loss is the difference between the IF output power and the RF input power and is relatively flat at around 9 dB over a substantial range of input power. The conversion loss compresses, that is, the loss increases by about 1 dB at an RF input power of 27 dBm which is very close to the local oscillator power of 27.5 dBm. In conventional mixers, the 1 db compression point of the conversion loss occurs at an input power that is 2–7 dB below the local oscillator power. The mixer in accordance with the present invention has a high 1 db compression point as a result of the reduction or elimination of the second harmonics. Accordingly, if the RF signal goes high, the circuit can maintain linearity over a large range of input RF power.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A microwave diode mixer, comprising:
   A) an RF signal input which receives first and second RF signals of closely related frequencies;
   B) a local oscillator signal input which receives a local oscillator signal;
   C) a diode quad having four arms, each said arm including at least one diode;
   D) an RF balun device coupling said RF signal input to said diode quad;
   E) a local oscillator balun device coupling said local oscillator signal input to said diode quad;
   F) a resonant circuit arrangement connected across said diode quad and having a bandwidth to present a substantially open circuit to the second harmonics of said first and second RF input signals.

2. A mixer according to claim 1 wherein:
   A) said resonant circuit arrangement is positioned in circuit between said RF signal input and said diode quad.

3. A mixer according to claim 2 wherein:
   A) said RF balun device includes a primary winding and a secondary winding;
   B) said resonant circuit arrangement includes said secondary winding and a string of resonant circuit elements connected in parallel with said secondary winding.

4. A mixer according to claim 3 wherein:
   A) said string of resonant circuit elements includes at least one capacitor.

5. A mixer according to claim 1 wherein:
   A) each said arm of said diode quad includes three said diodes.

* * * * *